United States Patent [19]
Nevill et al.

[11] Patent Number: 5,927,503
[45] Date of Patent: Jul. 27, 1999

[54] TRAY FOR PROCESSING AND/OR SHIPPING INTEGRATED CIRCUIT DEVICE

[75] Inventors: Leland R. Nevill; William C. Layer; Steven L. Hamren; Gregory A. Barnett, all of Boise, Id.

[73] Assignee: Micron Technology, Inc., Boise, Id.

[21] Appl. No.: 08/885,127

[22] Filed: Jun. 30, 1997

Related U.S. Application Data

[63] Continuation of application No. 08/412,433, Mar. 28, 1995, abandoned.

[51] Int. Cl.$^6$ .............................. B65D 1/34; B65D 85/00; B65D 85/30; B65D 85/48
[52] U.S. Cl. ........................ 206/701; 206/722; 206/725; 206/560; 206/564; 206/565; 257/666; 257/696; 257/730
[58] Field of Search .................... 206/560, 564, 206/565, 701, 706, 722, 725; 257/696, 730, 666

[56] References Cited

U.S. PATENT DOCUMENTS

| | | | |
|---|---|---|---|
| 3,454,921 | 7/1969 | Coleman et al. | 339/174 |
| 4,000,798 | 1/1977 | Cedrone | 193/40 |
| 4,417,777 | 11/1983 | Bamford | 339/17 |
| 4,435,724 | 3/1984 | Ralstin | 357/79 |
| 4,686,468 | 8/1987 | Lee et al. | 324/158 |
| 4,798,305 | 1/1989 | Laverty | 220/22.3 |
| 4,869,636 | 9/1989 | Reid et al. | 414/331 |
| 4,926,118 | 5/1990 | O'Conner et al. | 324/158 |
| 4,933,808 | 6/1990 | Horton et al. | 361/336 |
| 4,996,476 | 2/1991 | Balyasny et al. | 324/158 |
| 5,038,248 | 8/1991 | Meyer | 257/666 |
| 5,103,976 | 4/1992 | Murphy | 206/328 |
| 5,131,535 | 7/1992 | O'Connor et al. | 206/329 |
| 5,177,591 | 1/1993 | Emanuel | 257/666 |
| 5,184,068 | 2/1993 | Twigg et al. | 324/158 |
| 5,203,452 | 4/1993 | Small et al. | 206/329 |
| 5,208,529 | 5/1993 | Tsurishima et al. | 324/72.5 |
| 5,246,129 | 9/1993 | Small et al. | 220/23.4 |
| 5,475,259 | 12/1995 | Kasai et al. | |
| 5,531,329 | 7/1996 | Hayakawa et al. | 206/722 |
| 5,547,082 | 8/1996 | Royer et al. | 206/722 |
| 5,561,321 | 10/1996 | Hirano et al. | 437/218 |
| 5,596,282 | 1/1997 | Giddings et al. | 324/754 |
| 5,597,074 | 1/1997 | Ko | 206/725 |

FOREIGN PATENT DOCUMENTS 5-36870  2/1993  Japan.

OTHER PUBLICATIONS

"Module Kit Container", IBM Technical Disclosure Bulletin, vol. 28, No. 5, pp. 2175 and 2176, Oct. 1985.

*Primary Examiner*—Olik Chaudhuri
*Assistant Examiner*—Alonzo Chambliss

[57] ABSTRACT

An apparatus for processing an integrated circuit device comprises at least one insert having at least one beveled hole therein, the insert adapted to receive at least one semiconductor device. The apparatus further includes a tray having a pocket for receiving the insert and a slot, a deformable segment on the insert, and at least three posts on the insert. Further included is at least one tab on the deformable segment with one of the slots receiving the tab. The slot in the tray and the tab on the insert movably attaches the insert to the tray, the insert being self-aligning to a processing apparatus thereby in conjunction with the posts and allowing for removal of the insert from the pocket.

25 Claims, 7 Drawing Sheets ly attaching each of the plurality of inserts to the tray, each of
TRAY FOR PROCESSING AND/OR SHIPPING INTEGRATED CIRCUIT DEVICE This is a continuation of application Ser. No. 08/412,433, filed Mar. 28, 1995, now abandoned.

FIELD OF THE INVENTION

This invention relates to the field of semiconductor manufacture, and more particularly to an apparatus for transporting, testing, burning-in, and/or shipping integrated circuit devices.

BACKGROUND OF THE INVENTION

Burning-in and rigorous electrical testing of integrated circuit devices (IC's) typically occurs after each device is individually encapsulated in plastic or packaged in ceramic. With devices having through-hole leads, such as dual in-line packages (DIP's) and zigzag in-line packages (ZIP's), the leads are formed before the device is burned-in and tested. Devices having surface-mount leads, such as thin small outline packages (TSOP's) typically comprise a carrier ring and are individually tested and burned-in with the leads straight supported by the carrier ring, then the leads are subsequently formed.

The devices are typically placed in plastic tubes for transportation and removed from the tubes for testing or other processing such as burn-in. The requirement of removing devices from a tube is not desirable as it requires additional time and can be a process which contributes to damaged devices from bending the leads due to excessive handling. In addition, each time the device is removed from the tube it must be replaced in the tube with the correct orientation which can be time consuming and a source of error.

Semiconductor manufacturers have attempted to use trays in place of tubes. Each tray receives a plurality of semiconductor devices which can be tested within the tray as access to the leads is available. The trays, however, are typically expensive to manufacture and are device-specific. A number of tray designs must be stocked as a different tray must be used for each type of IC manufactured by a semiconductor supplier. After testing, the devices are removed from the tray and placed in tubes for shipment.

A method and apparatus which allows for testing or other processing and transportation of semiconductor devices inexpensively and with minimal handling would be desirable.

SUMMARY OF THE INVENTION

An apparatus for processing and/or shipping integrated circuit devices comprises a plurality of inserts, each of the inserts adapted to receive at least one semiconductor device, and a tray for receiving at least one insert, or preferably a plurality of inserts. One embodiment of the apparatus further comprises means for movably attaching each of the plurality of inserts to the tray, each of the inserts being self-aligning to a processing apparatus thereby. The means for movably attaching further allows for removal of each of the inserts from the tray.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
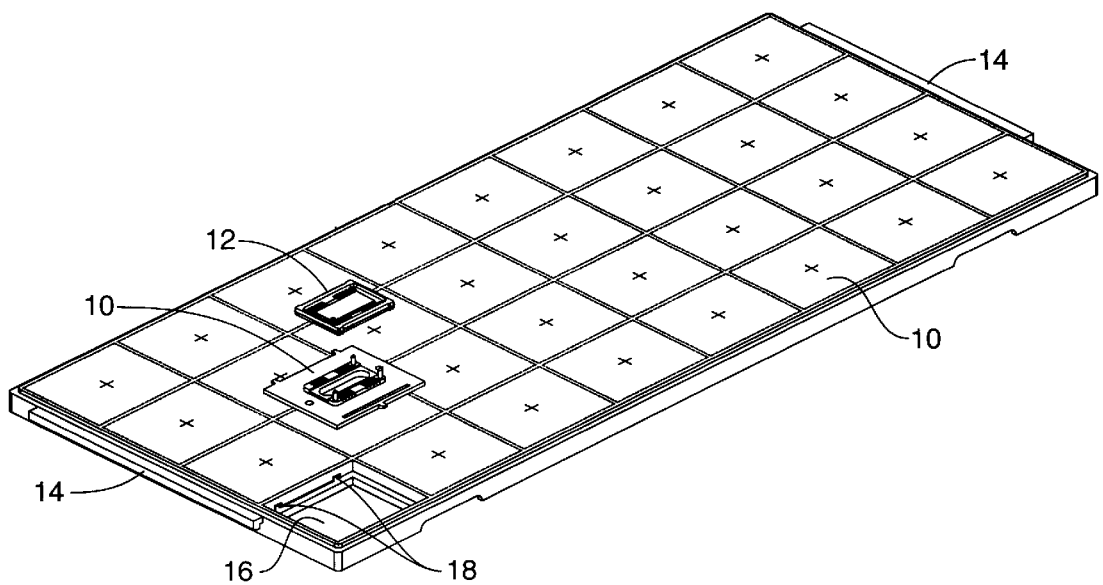
FIG. 1 is an isometric view of a tray and inserts.
Figure 2:
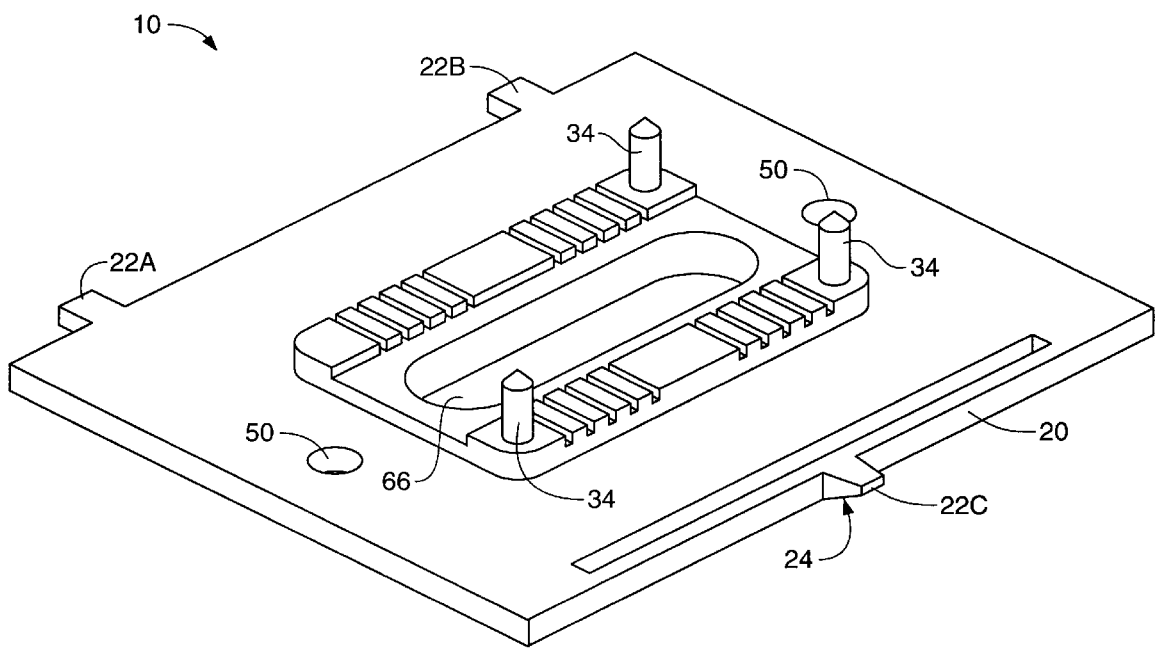
FIG. 2 is an isometric view of an insert.

An apparatus for processing and/or shipping integrated circuit devices, as shown in FIGS. 1 and 2 comprises a plurality of inserts 10, each of the inserts for receiving at least one semiconductor device package 12, and a tray 14. The tray can comprise a plurality of pockets 16, each of the pockets for receiving one of the inserts. The pockets allow the inserts to be recessed in the tray and allows the assembly to have a reduced thickness. This may facilitate ease of storage and adherence to dimensional requirements.

The apparatus can further comprise means for movably attaching each of the plurality of inserts to the tray, each of the inserts being self-aligning to a processing apparatus thereby, such as a test head. The means for movably attaching the inserts to the tray further allows for removal of each of the inserts from the tray and can comprise various configurations, such as a plurality of slots 18 in the tray 14 and a movable or deformable segment 20 and one or more tabs 22 on each of the inserts 10 as shown in FIG. 2. In the FIG. 2 embodiment, two tabs 22a, 22b are shown on one side of the insert and one tab 22c is shown on the movable segment 20 although other configurations are possible. In use, the tabs 22 on each of the inserts 10 are received by one of the slots 18 in the tray 14. The tabs 22a, 22b on the side of the insert opposite the movable segment are inserted into their respective slots and the movable segment is compressed to allow the tab thereon 22c to fit into one of the slots on the tray. A beveled lip above the slot for the tab on the movable segment, or a beveled portion 24 on tab 22c itself of the moveable segment 20, allows for the attachment of the insert 10 to the tray 14 with a downward force rather than having to compress the movable segment. Either the beveled lip on the tray or the bevel on tab 22c aids in attachment of the insert to the tray. As can be seen in FIGS. 1 and 2 the insert and tray each have a generally planar profile. In this embodiment, the moveable or deformable segment and the tabs are coplanar with the planar profile of the insert.

Figure 3:
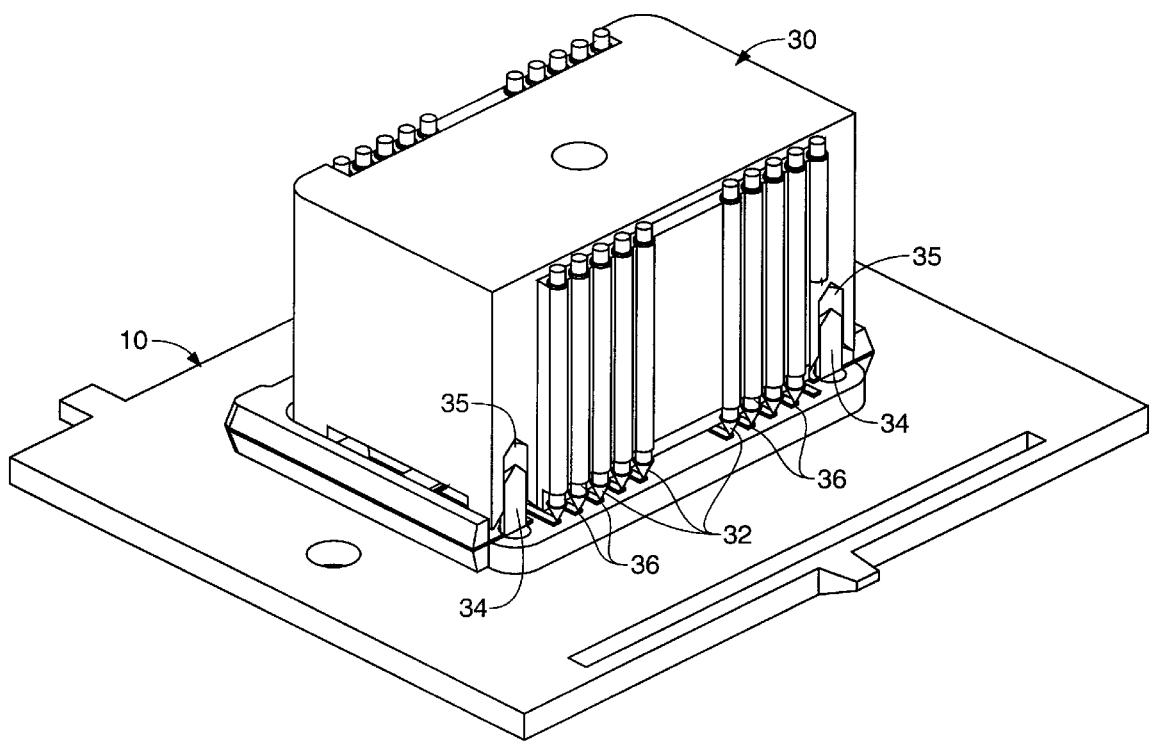
FIG. 3 is an isometric view of a processing apparatus contacting leads of an integrated circuit device mounted to an insert.

In one embodiment, the tabs on the insert can be smaller in both the X- and Y-directions than the holes on the tray which receive them which allows the inserts to move (to "float") within the tray in the X- and Y-directions with respect to the planar profile of the tray (i.e. in a plane generally parallel with the planar profile of the tray). In use, a floating insert is self-aligning to a processing apparatus. For example, a processing apparatus 30 such as a test head can have contacts 32 formed for a lead configuration as shown in FIG. 3. The tray 14 having IC's attached to floating inserts is brought in close proximity to the processing apparatus 30. Posts 34 on the insert 10 align with holes 35 in the processing apparatus and bring the insert, and therefore the IC, into alignment with the processing apparatus. The contacts 32 on the processing apparatus contact leads 36 on the packaged IC device 12 to allow an electrical signal to pass therebetween. The IC can then be tested according to means known in the art.

Figure 4:
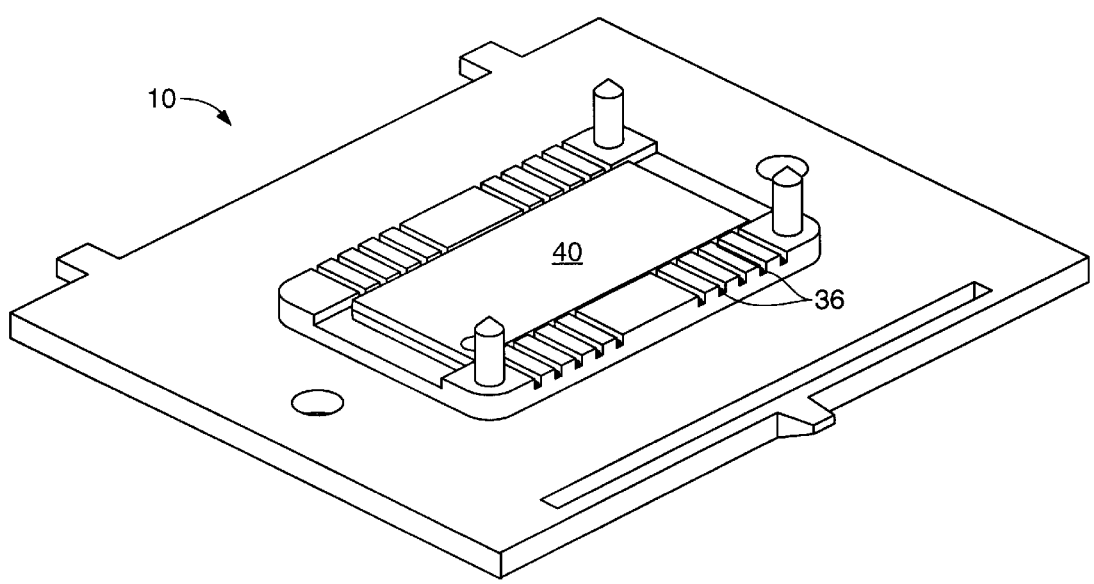
FIG. 4 is an isometric view of an integrated circuit device held by an insert.

The inserts can be used in combination with integrated circuit devices having various configurations. As shown in FIG. 4, the packaged semiconductor device 12 comprises a body 40 and leads 36, the leads being straight and extending from the body and being supported by the insert. The leads are separated and held in place by ridges on the insert as shown.

Figure 5:
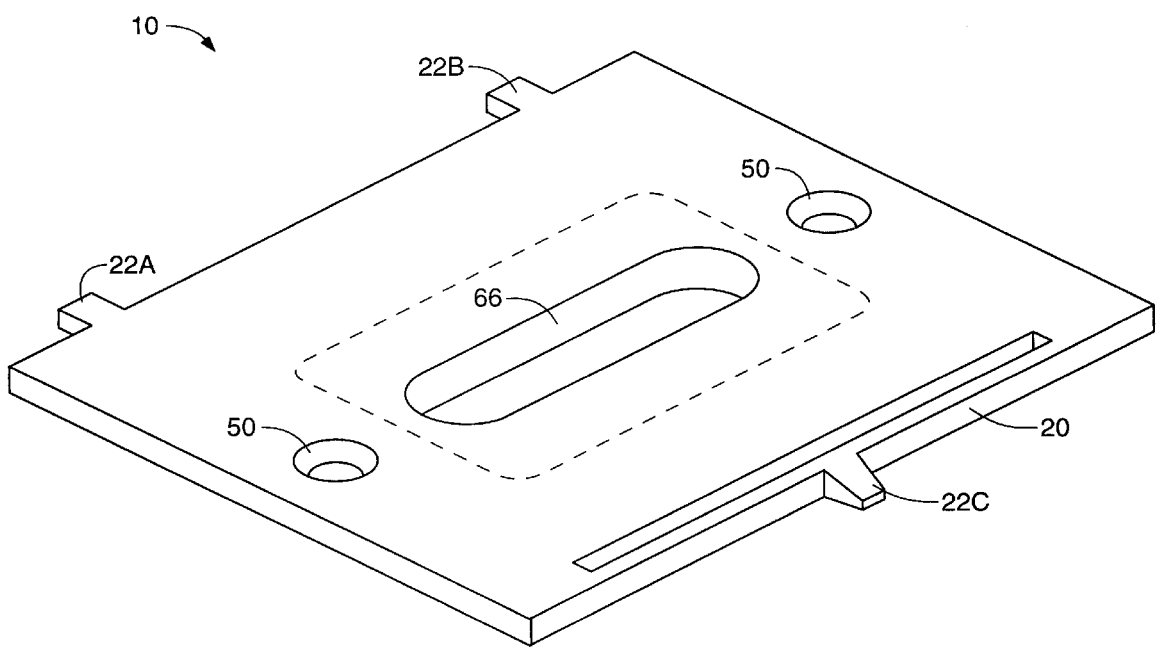
FIG. 5 is an isometric view of a back of an insert.

As shown in FIG. 5, the inserts can comprise at least one beveled hole 50 in the back of the insert 10, with two beveled holes 50 shown. The beveled hole is used for aligning the insert 10 to facilitate attachment of the packaged IC 12 to the insert 10. In use, the beveled holes 50 in the back of the insert are placed onto a pair of shafts (not shown) which protrude into the beveled holes. The shafts, which are aligned to a known location, place the insert into a fixed location. The insert is thereby aligned to the shafts and allows for the automated aligned insertion of the IC onto the insert. Alternately, the shaft can be tapered to fit within the beveled hole, which is equivalent to the arrangement described above.

Figure 6:
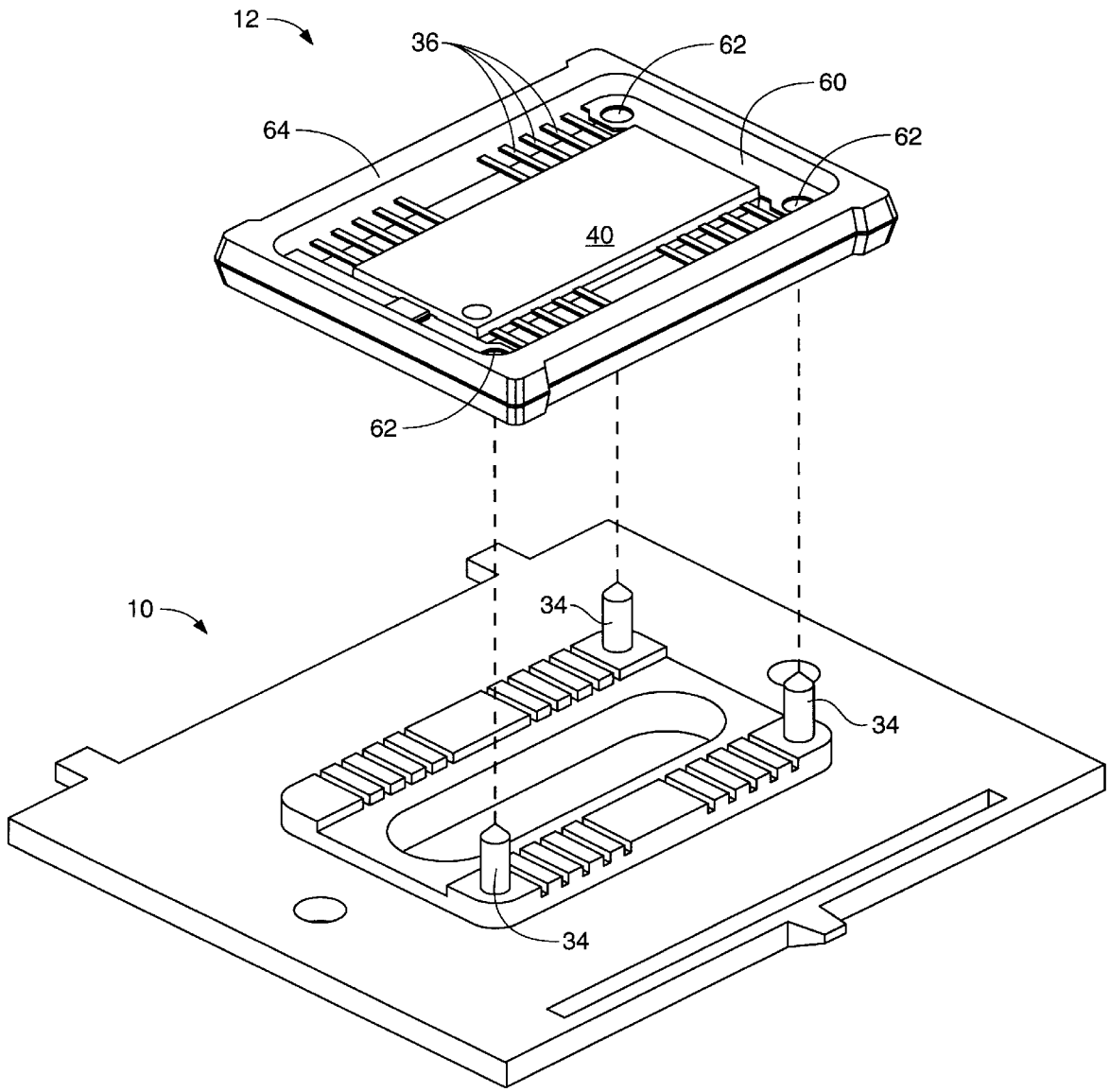
FIG. 6 is an isometric view of an integrated circuit device comprising a carrier ring held by an insert.

The insert can further be used with integrated circuit devices having carrier rings as shown in FIG. 6 which are often used during the manufacture of thin small outline packages (TSOP's). TSOP's comprise a lead frame 60 external to plastic encapsulation of the package body 40 and having a plurality of holes therein 62 and a plastic ring 64 which supports the leads 36 of the device. The inserts comprise a plurality of posts 34 which extend through the holes 62 in the lead frame 60 to align the packaged semiconductor device 12 with the insert 10. These posts 34 can further be used as described above to align the IC with a processing apparatus.

The insert 10 can further comprise a hole 66 as shown in FIG. 2 to allow for the flow of air to a packaged IC attached to the insert. The tray is open at the bottom to also allow for the flow of air. As an integrated circuit device is being processed such as during testing, nonambient air can be blown through the holes in the tray and the insert to heat or cool the IC to allow for more rigorous testing. This also allows for more efficient burning-in of the device.

Figure 7:
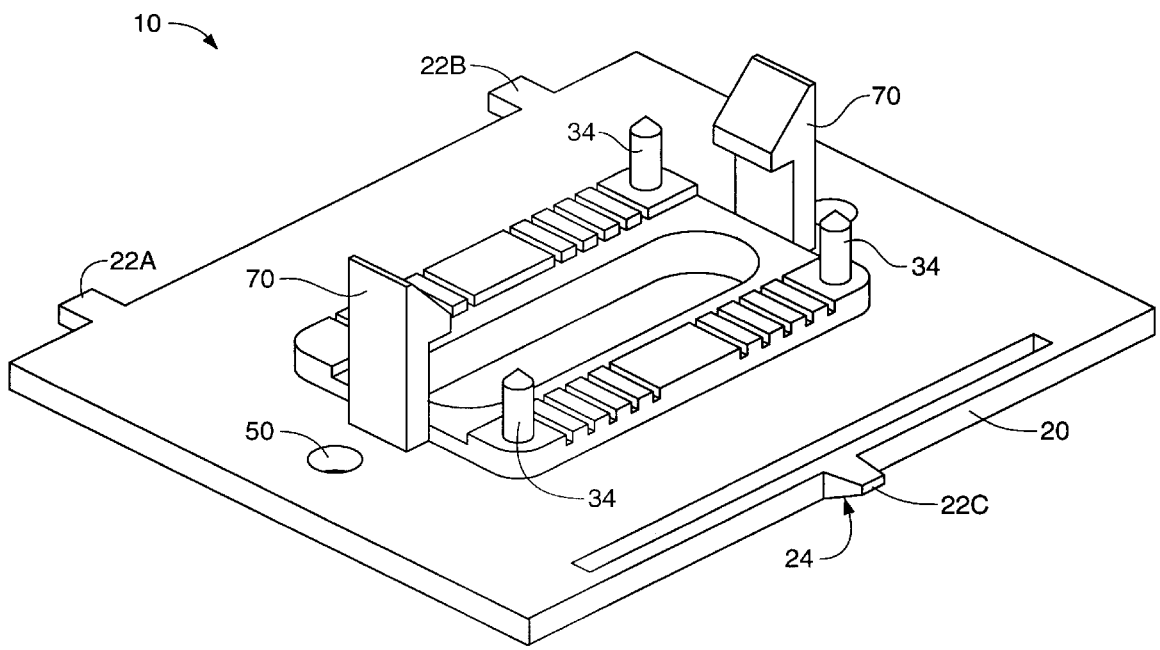
FIG. 7 is an isometric view of an insert comprising clips for securing an integrated circuit device to the insert.

In use, the inserts are attached to the tray, and a semiconductor device is placed onto a device-specific insert which supports the packaged IC. The IC can be set onto the insert and held by gravity, or a clip 70 can be used to hold the IC to the insert as shown in FIG. 7. Alignment of the IC to the insert can be facilitated by the use of the beveled hole in the back of the insert by placing the insert onto a shaft to protrude into the beveled hole as previously described. The insert is thereby aligned to allow for the aligned insertion of the IC onto the insert.

After the IC's are attached to the inserts the devices can be marked, scanned, tested, burned-in, transported or otherwise processed on the tray. The trays can be stackable which allows for ease of transportation, storage and shipping. After the devices have been tested and/or burned-in they can be removed from the tray for formation of the leads. If the leads of the devices are formed before the IC's are assembled to the tray the IC's can be shipped in the tray after processing to the customer. Additionally, the devices can be shipped with the leads not formed for formation by the customer into the desired configuration. The customer, thereby, may order a quantity of devices and form the leads according to their needs.

The insert can be removably attached to the tray to allow for replacement of the insert within the tray for different styles of IC packages. Device-specific trays, therefore, are not required. An IC manufacturer can stock one tray and a number of device-specific inserts. Compared to a device-specific tray, having a generic tray and device-specific inserts is much less expensive, for example because of the reduced materials required for their manufacture.

In contrast with tubes, the leads of the packaged IC's are accessible and can be contacted physically and/or electrically with a processing apparatus such as a test head while the IC is attached to the device-specific insert. After testing, the integrated circuit can be removed from the insert and the leads can be subsequently formed. Forming the leads just prior to shipping the IC to a customer reduces the possibility of the leads being out of specifications.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. An apparatus for processing semiconductor devices, comprising:

at least one insert adapted to receive at least one semiconductor device;

a tray having a generally planar profile, said tray adapted to receive said insert; and means for releasably attaching said insert to said tray such that said insert can move in a plane generally parallel with said planar profile of said tray.

2. The apparatus of claim 1 wherein said tray has a slot therein and said means for attaching comprises:

a movable segment on said insert, said movable segment having first and second ends with each end connected to said insert; and at least one tab on said insert, said slot receiving said tab.

3. The apparatus of claim 1 wherein said tray has at least two slots therein, said insert has a generally planar profile, and said means for attaching comprises:

a movable segment on said insert, said movable segment having a tab thereon; and at least one tab opposite said movable segment;

wherein said movable segment and said at least one tab are coplanar with said planar profile of said insert and one of said slots receives each of said tabs.

4. The apparatus of claim 1 wherein said insert further comprises a front and a back, said back having at least one beveled hole therein.

5. The apparatus of claim 1 wherein said tray and said insert have holes therein to allow for the flow of air to a semiconductor device received by said insert.

6. The apparatus of claim 1 wherein said tray comprises a pocket therein, said insert received by said pocket.

7. The apparatus of claim 1 wherein said insert is adapted to move in X- and Y-directions with respect to said planar profile of said tray.

8. An apparatus for processing semiconductor devices, comprising:

at least one insert adapted to receive at least one semiconductor device and having a generally planar portion;

a tray having a slot and a pocket, said pocket receiving said insert;

a deformable segment on said insert coplanar with said planar portion of said insert;

at least one tab on said segment, said slot receiving said tab, wherein said slot in said tray and said tab on said insert movably attach said insert to said tray and allow for removal of said insert from said pocket.

9. The apparatus of claim 8 wherein said insert further comprises a front and a back, said back having at least one beveled hole therein.

10. The apparatus of claim 8 wherein said tray and said insert have holes therein to allow for the flow of air to a semiconductor device attached to said insert.

11. An apparatus for processing a semiconductor device, comprising:

at least one insert having at least one beveled hole therein, said insert adapted to receive at least one semiconductor device and having a generally planar portion;

a tray having a pocket for receiving said insert, a generally planar portion, and at least one slot therein;

a deformable segment on said insert having first and second ends each connected with said insert and each end coplanar with said planar portion of said insert;

at least three posts on said insert;

at least one tab on said deformable segment coplanar with said planar portion of said insert, said slot receiving said tab, wherein said slot in said tray and said tab on said insert movably attach said insert to said tray, said insert adapted to move in X- and Y- directions with respect to said planar portion of said tray and being self-aligning to a processing apparatus thereby in conjunction with said posts, wherein said deformable segment allows for removal of said insert from said pocket.

12. The apparatus of claim 11 wherein said tray and said insert have holes therein to allow for the flow of air to a semiconductor device attached to said insert.

13. An apparatus for testing and shipping a plurality of semiconductor devices comprising:

a tray having a generally planar profile;

a plurality of removable inserts attached to said tray, said inserts adapted to move in X- and Y-directions with respect to said planar profile of said tray.

14. The apparatus of claim 13 wherein each said removable insert has a generally planar profile and comprises a deformable segment coplanar with said planar profile of said insert and further comprises at least one tab on said deformable segment, and said tray has a plurality of slots therein with each said slot receiving one of said tabs, wherein each said insert is movably and removably attached to said tray using said deformable segment.

15. The apparatus of claim 14 wherein said insert has a generally planar profile, wherein said at least one tab is a first tab and each said insert further comprises a second tab at a side of said insert opposite said first tab coplanar with said first tab and with said planar profile of said insert, wherein said second tab is received by one of said slots of said tray.

16. The apparatus of claim 15 wherein each said second tab is beveled.

17. An apparatus comprising:

a tray having a generally planar surface;

a plurality of inserts, each insert attached to said tray, wherein each said insert is adapted to move independently of other said inserts in X- and Y-directions with respect to said planar surface of said tray;

a plurality of semiconductor devices, wherein each of said semiconductor devices is attached to one of said inserts.

18. The apparatus of claim 17 further comprising a tester for testing said semiconductor devices comprising a test head which contacts said semiconductor devices wherein said inserts are adapted to self-align said semiconductor devices to said test head in response to contacting said test head with said semiconductor devices.

19. The apparatus of claim 17 wherein each said insert has a generally planar profile and said tray has a plurality of holes therein, further comprising at least one tab on each said insert coplanar with said planar profile of said insert wherein each said tab is received by one of said holes in said tray.

20. The apparatus of claim 19 wherein said tab on each said insert is a first tab, further comprising:

a deformable segment having first and second ends with each end coplanar with said planar profile of said insert;

a second tab on said deformable segment, wherein said first and second tabs are coplanar with said planar profile of said insert and said second tab is on an opposite side of said insert from said first tab.

21. An apparatus for processing semiconductor devices, comprising:

a plurality of inserts adapted to receive at least one semiconductor device;

a tray adapted to receive said inserts;

a connection for releasably attaching said inserts to said tray such that each said insert can move in a lateral direction with respect to other said inserts received by said tray.

22. The apparatus of claim 21 wherein said inserts lie in a common plane and said inserts move independently in a direction parallel with said common plane.

23. An apparatus for processing semiconductor devices, comprising:

a plurality of semiconductor devices each having a generally planar profile;

a plurality of inserts adapted to receive at least one said semiconductor device;

a tray adapted to receive said plurality of inserts;

a connection for attaching said inserts to said tray such that said connection provides independent lateral movement of each said at least one semiconductor device with respect to other said plurality of semiconductor devices.

24. The apparatus of claim 23 further comprising:

a deformable segment on each said insert having a plane parallel with said generally planar profile of said semiconductor devices;

at least one tab on each said deformable segment;

said tray having a plurality of holes therein, wherein each said slot in said tray receives one of said tabs and allows for removal of each said insert from said tray.

25. The apparatus of claim 23 wherein said semiconductor devices lie in a common plane and said connection is adapted to allow independent movement of each said at least one semiconductor device with respect to other said at least one semiconductor devices independently in a direction parallel with said common plane.

* * * * *